US007646259B2

(12) United States Patent
Chang et al.

(10) Patent No.: US 7,646,259 B2
(45) Date of Patent: Jan. 12, 2010

(54) TOOLLESS VIDEO BALUN

(75) Inventors: Ray Chang, Hsichih-Taipei (TW); Joel Feinberg, Framingham, MA (US)

(73) Assignees: Telebox Industries Corp, Hsichih-Taipei (TW); Videobaluns Unlimited, LLC, Framingham, MA (US)

( * ) Notice: Subject to any disclaimer, the term of this patent is extended or adjusted under 35 U.S.C. 154(b) by 159 days.

(21) Appl. No.: 11/987,553

(22) Filed: Nov. 30, 2007

(65) Prior Publication Data

US 2009/0140822 A1 Jun. 4, 2009

(51) Int. Cl.
*H03H 7/42* (2006.01)
*H01R 12/14* (2006.01)
*H01R 4/26* (2006.01)

(52) U.S. Cl. ........................................ 333/25; 439/387

(58) Field of Classification Search .................. 333/25; 439/166, 387, 389; 174/520
See application file for complete search history.

(56) References Cited

U.S. PATENT DOCUMENTS

| | | | | |
|---|---|---|---|---|
| 5,738,546 | A * | 4/1998 | Burroughs et al. | 439/620.03 |
| 6,033,255 | A * | 3/2000 | Murofushi | 439/397 |
| 6,590,469 | B1 * | 7/2003 | Patel | 333/25 |

* cited by examiner

*Primary Examiner*—Robert Pascal
*Assistant Examiner*—Alan Wong
(74) *Attorney, Agent, or Firm*—Jackson IPG PLLC

(57) ABSTRACT

A toolless video balun is disclosed to include a bottom cover shell covered with a top cover shell to hold a circuit board and a BNC connector, two metal terminals bonded to the circuit board with the respective sharp-edged top metal holder portions respectively inserted into respective insertion slot in a terminal block at the top cover shell, and a pressure cap pivoted to the top cover shell for holding down electrical wires of a network line in wire grooves in the terminal block for causing the metal holder portions of the metal terminals to make contact with conductors of the electrical wires of the network line respectively.

6 Claims, 7 Drawing Sheets

TOOLLESS VIDEO BALUN

BACKGROUND AND SUMMARY OF THE INVENTION

The present invention relates to a video balun and more particularly, to a toolless video balun that allows quick connection to a network line without tools, and assures positive positioning of the BNC connector in between the top cover shell and the bottom cover shell.

For long distance transmission (about 100~200 foot) of audio/video signal or data to prevent common-mode interference, the most economic way is to transmit signal in a balanced manner through a network line of impedance about 120-ohm between the two sides. However, a regular signal source is a balanced signal of impedance about 75-ohm. Therefore, the signal must be converted from 75-ohm into 120-ohm before transmission. In this case, an impedance converter is used to convert the 75-ohm of the signal into 120-ohm, and then a video balun is used to convert the unbalanced signal into a balanced signal for output. A video balun for this purpose is known its one side provided with a Bayonet Neill-Concelman (hereinafter referred as BNC) connector for connection to an electronic video camera, monitor, video apparatus or the like, and its opposite side provided with two metal terminals for the connection of the two electrical wires of a network line. Before connection, a cutting tool must be used to cut the insulation of the two electrical wires of the network line, and then the conductors of the electrical wires are respectively fastened to the metal terminals of the video balun with a respective screw or directly bonded to the metal terminals with a solder material. This network line mounting procedure consumes much labor and time.

The present invention has been accomplished under the circumstances in view. It is one object of the present invention to provide a toolless video balun, which allows quick connection to a network line without tools. According to one aspect of the present invention, the toolless video balun comprises a bottom cover shell covered with a top cover shell to hold a circuit board and a BNC connector, two metal terminals bonded to the circuit board with the respective sharp-edged top metal holder portions respectively inserted into respective insertion slot in a terminal block at the top cover shell, and a pressure cap pivoted to the top cover shell for holding down electrical wires of a network line in wire grooves in the terminal block for causing the sharp-edged top metal holder portions of the metal terminals to make contact with conductors of the electrical wires of the network line respectively.

According to another aspect of the present invention, the bottom cover shell and the top cover shell each comprise a semicircular flange. The semicircular flange of the top cover shell and the semicircular flange of the bottom cover shell are abutted against each other to hold the BNC connector firmly in place. The BNC connector has a cylindrical block disposed at its one end and set in between the semicircular flange of the top cover shell and the semicircular flange of the bottom cover shell. Further, the semicircular flange of the bottom cover shell has two engagement ribs protruding from its top wall and symmetrically disposed at two sides, and a flat surface portion disposed e between the two engagement ribs. The cylindrical block of the BNC connector has a flat bottom wall supported on the flat surface portion of the semicircular flange of the bottom cover shell, and a locating groove extending around the periphery and forced into engagement with the engagement ribs of the semicircular flange of the bottom cover shell.

According to still another aspect of the present invention, the pressure cap has one end pivoted to the top cover shell and the other end provided with at least one retaining block, and the bottom cover shell has at least one retaining hole at its one end for receiving the at least one retaining block of the pressure cap when the pressure cap is closed on the top cover shell to hold down the inserted electrical wires in the sharp-edged top metal holder portions of the metal terminals.

DETAILED DESCRIPTION OF THE INVENTION

Figure 1:
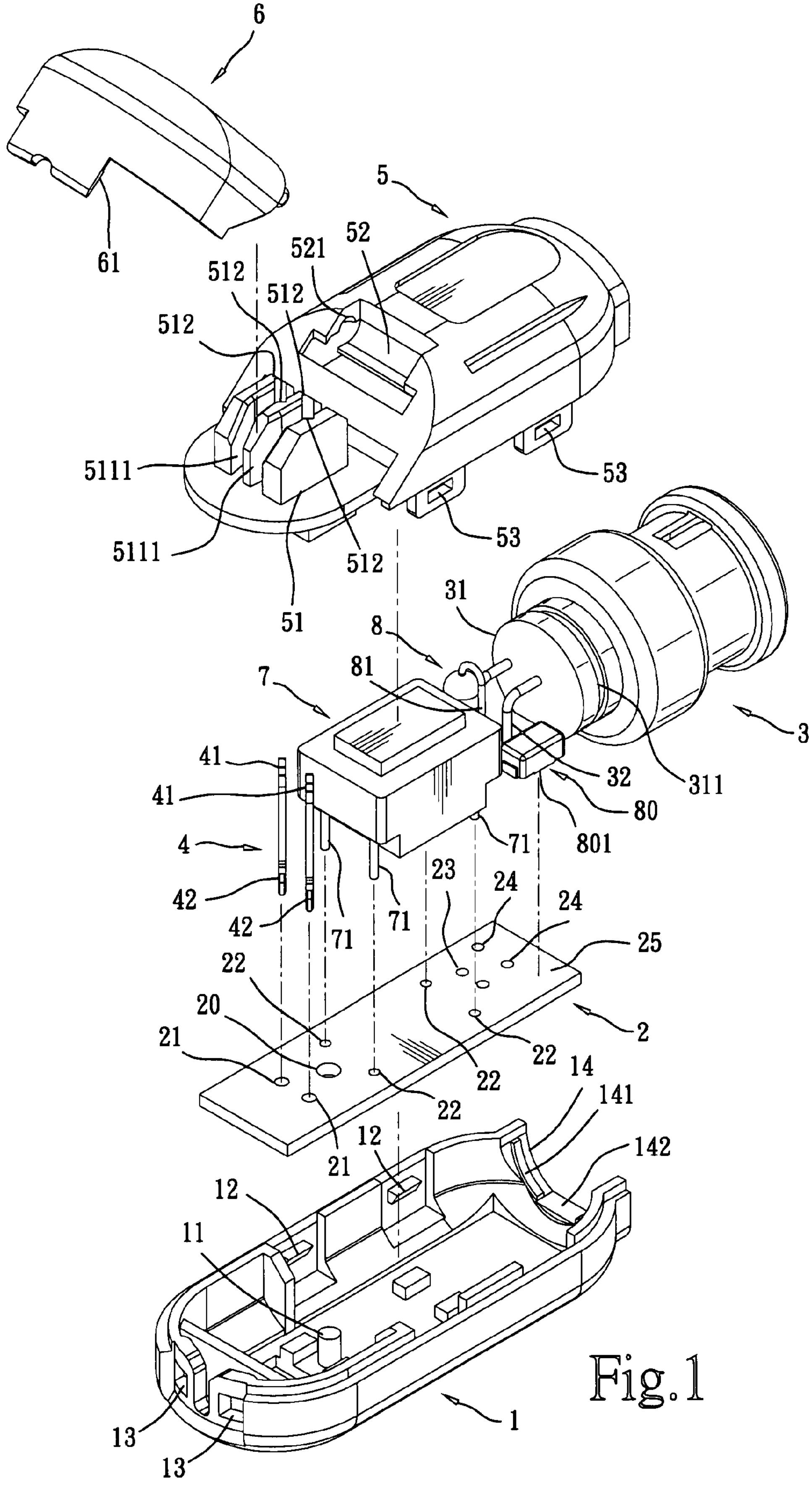
FIG. 1 is an exploded view of a toolless video balun according to the present invention.
Figure 2:
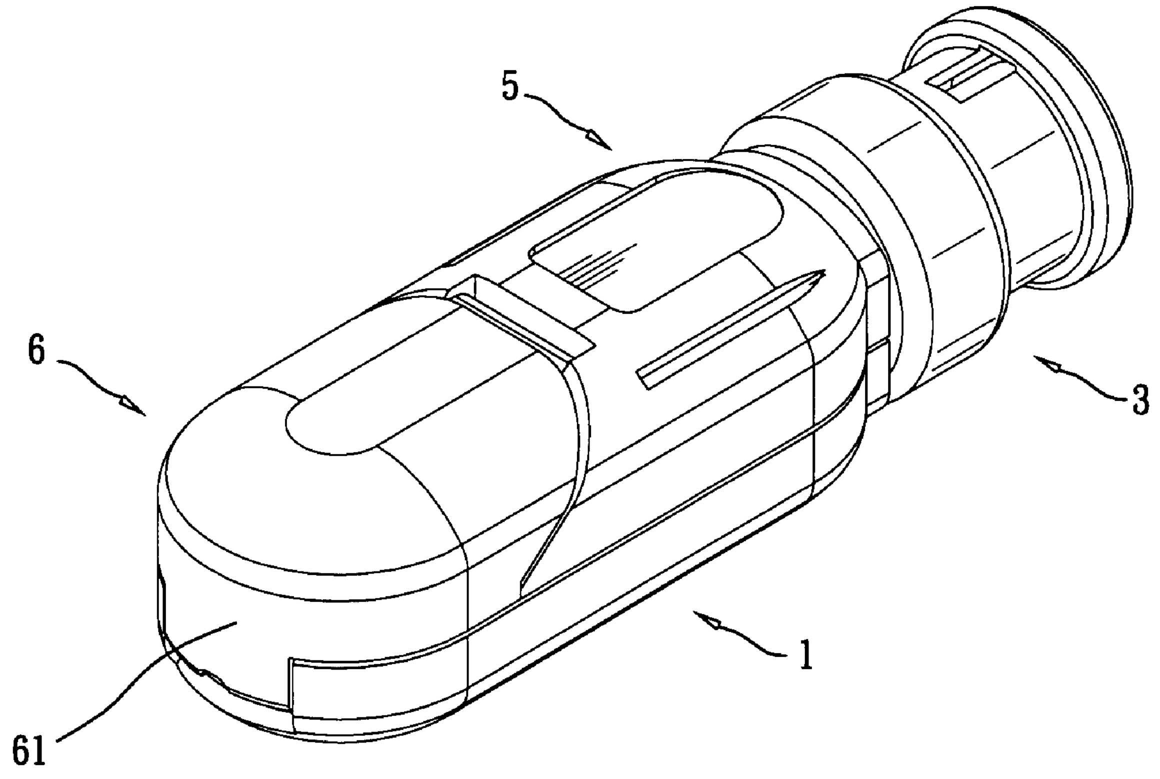
FIG. 2 is an elevational assembly view of the toolless video balun according to the present invention.

Referring to FIGS. 1~6, a toolless video balun in accordance with the present invention is shown comprised of a bottom cover shell 1, a circuit board 2, a BNC connector 3, two metal terminals 4, a top cover shell 5, and a pressure cap 6.

The bottom cover shell 1 comprises at least one column 11 for securing the circuit board 2 to hold the circuit board 2 on the inside, a plurality of hooks 12 symmetrically disposed at two opposite lateral sides for securing the top cover shell 5, a plurality of retaining holes 13 disposed at its one end, namely, the close front end, for securing the pressure cap 6, and a semicircular flange 14 extending from its other end, namely, the open rear end. The open rear end of the bottom cover shell 1 has a diameter gradually reducing toward the semicircular flange 14. The semicircular flange 14 has two engagement ribs 141 protruding from its top wall and symmetrically disposed at two sides, and a flat surface portion 142 disposed on the middle between the two engagement ribs 141.

The circuit board 2 is mounted inside the bottom cover shell 1, comprising at least one locating hole 20 fastened to the at least one column 11 of the top cover shell 1, a plurality of via holes 21~24 for the bonding of the bottom mounting tips 42 of the metal terminals 4, the metal pins 71 of a winding transformer 7, the lead wire 81 of a resistor 8 and the metal pins 32 of the BNC connector 3, and a bonding pad 25 for the bonding of the bottom bonding side 801 of a diode 80.

The BNC connector 3 has a cylindrical block 31 axially extending from its one end, a plurality of insertion holes 33 axially disposed in its other end (see FIGS. 4 and 5), and two metal pins 32 extending out of the cylindrical block 31 and curved downwards. The metal pins 32 are extending out of the front side of the cylindrical block 31 horizontally and then curved vertically downwards with the respective bottom ends 321 bonded to the via holes 24 of the circuit board 2. The cylindrical block 31 has a flat bottom wall 312 (see FIG. 3) supported on the flat surface portion 142 of the semicircular flange 14 of the bottom cover shell 1, and a locating groove 311 extending around the periphery and forced into engagement with the engagement ribs 141 of the semicircular flange 14 of the bottom cover shell 1.

The metal terminals 4 each have a bottom mounting tip 42 respectively bonded to the via holes 21 of the circuit board 2, and a sharp-edged top metal holder portion 41 respectively inserted into top cover shell 5.

The top cover shell 5 comprises a terminal block 51 disposed at its one end, two insertion slots 511 vertically extending through the top and bottom sides of the terminal block 51 for receiving the sharp-edged top metal holder portions 41 of the metal terminals 4 respectively, three upright flanges 512 protruded from the top wall of the terminal block 51, two wire grooves 5111 respectively defined between each two adjacent upright flanges 512 and respectively disposed in communication with the insertion slots 511, an opening 52 disposed adjacent to the upright flanges 512, two coupling holes 521 disposed in the opening 52 at two sides (see FIGS. 1, 4 and 5) for the coupling of the pressure cap 6, a plurality of retaining holes 53 symmetrically disposed at its two opposite lateral sides for receiving the hooks 12 of the bottom cover shell 1, and a semicircular flange 54 extending from its other end for pressing on the cylindrical block 31 of the BNC connector 3 to hold down the cylindrical block 31 of the BNC connector 3 on the semicircular flange 14 of the bottom cover shell 1.

Figure 5:
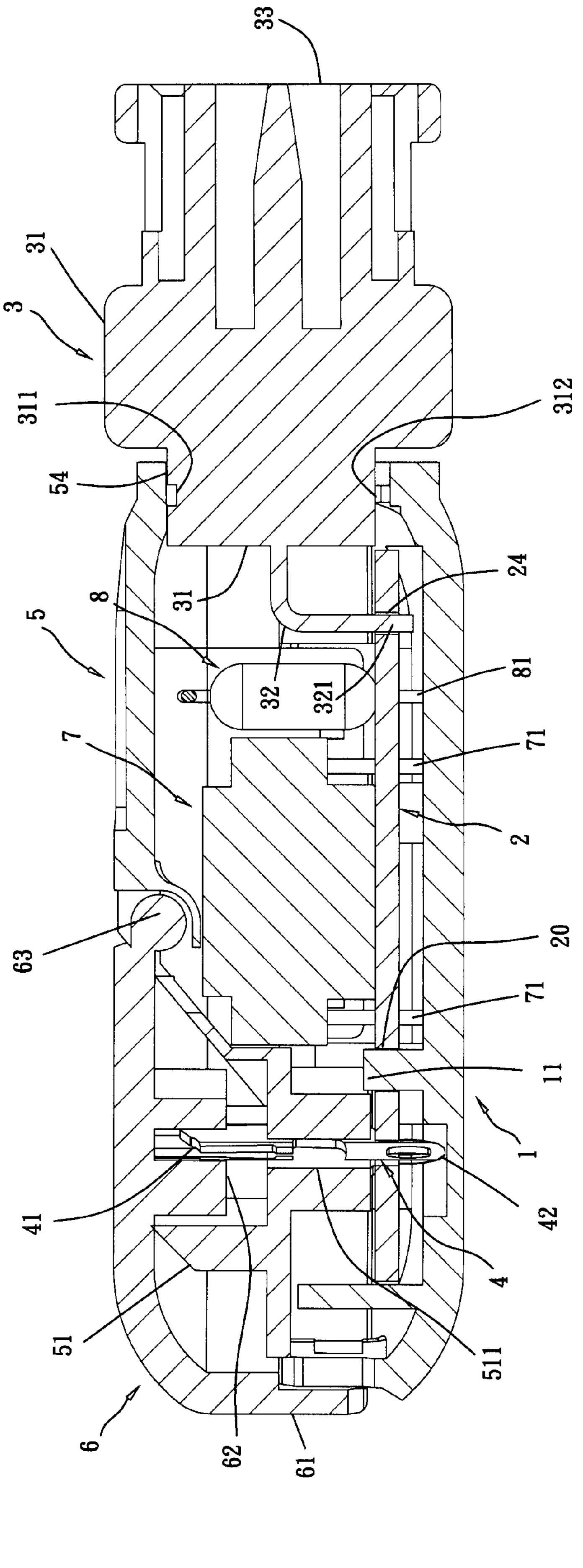
FIG. 5 corresponds to FIG. 4, showing the electrical wires of a network line inserted into the wire grooves of the top cover shell and the pressure cap closed.
Figure 6:
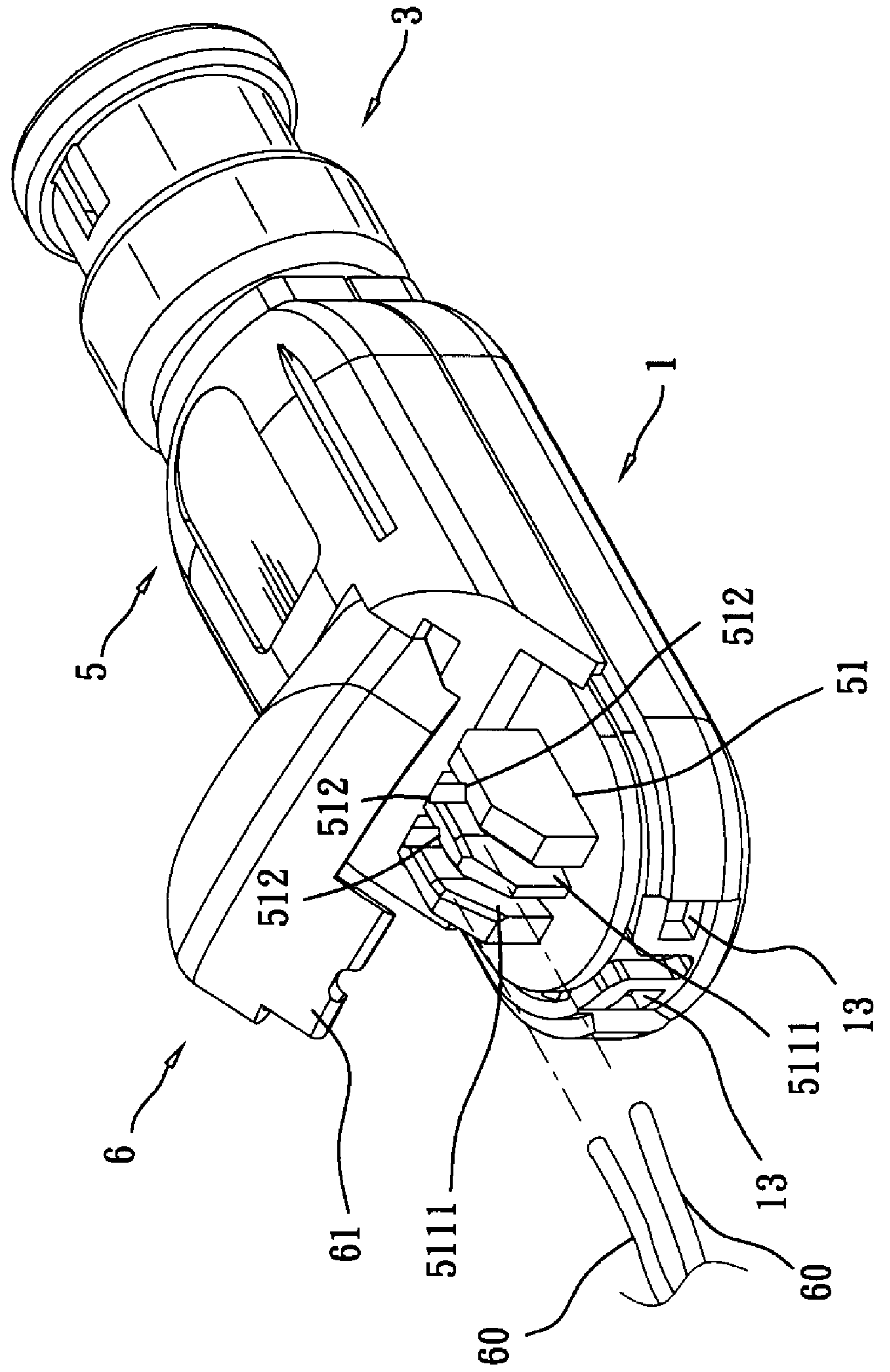
FIG. 6 is a schematic elevational view of the present invention, showing the pressure cap opened for the insertion of the electrical wires of a network line into the wire grooves of the top cover shell.

The pressure cap 6 has an extension flange 61 downwardly disposed at its one end, two retaining blocks 611 protruded from an inner side of the extension flange 61 (see FIG. 3) for engaging the retaining holes 13 of the bottom cover shell 1, two holding down blocks 62 protruded from its bottom wall corresponding to the wire grooves 5111 of the top cover shell 5, a coupling block 63 fixedly disposed at its other end corresponding to the opening 52 of the top cover shell 5, and two round pins 631 respectively axially extending from two sides of the coupling block 63 and respectively pivotally coupled to the coupling holes 521 in the opening 52 of the top cover shell 5. After coupling of the two round pins 631 of the coupling block 63 to the coupling holes 521 in the opening 52 of the top cover shell 5, the pressure cap 6 can be turned relative to the top cover shell 5 between the open position shown in FIG. 4 and the close position shown in FIG. 5. When the pressure cap 6 is turned to the close position as shown in FIG. 5, the holding down blocks 62 are forced into the wire grooves 5111 of the top cover shell 5.

Figure 3:
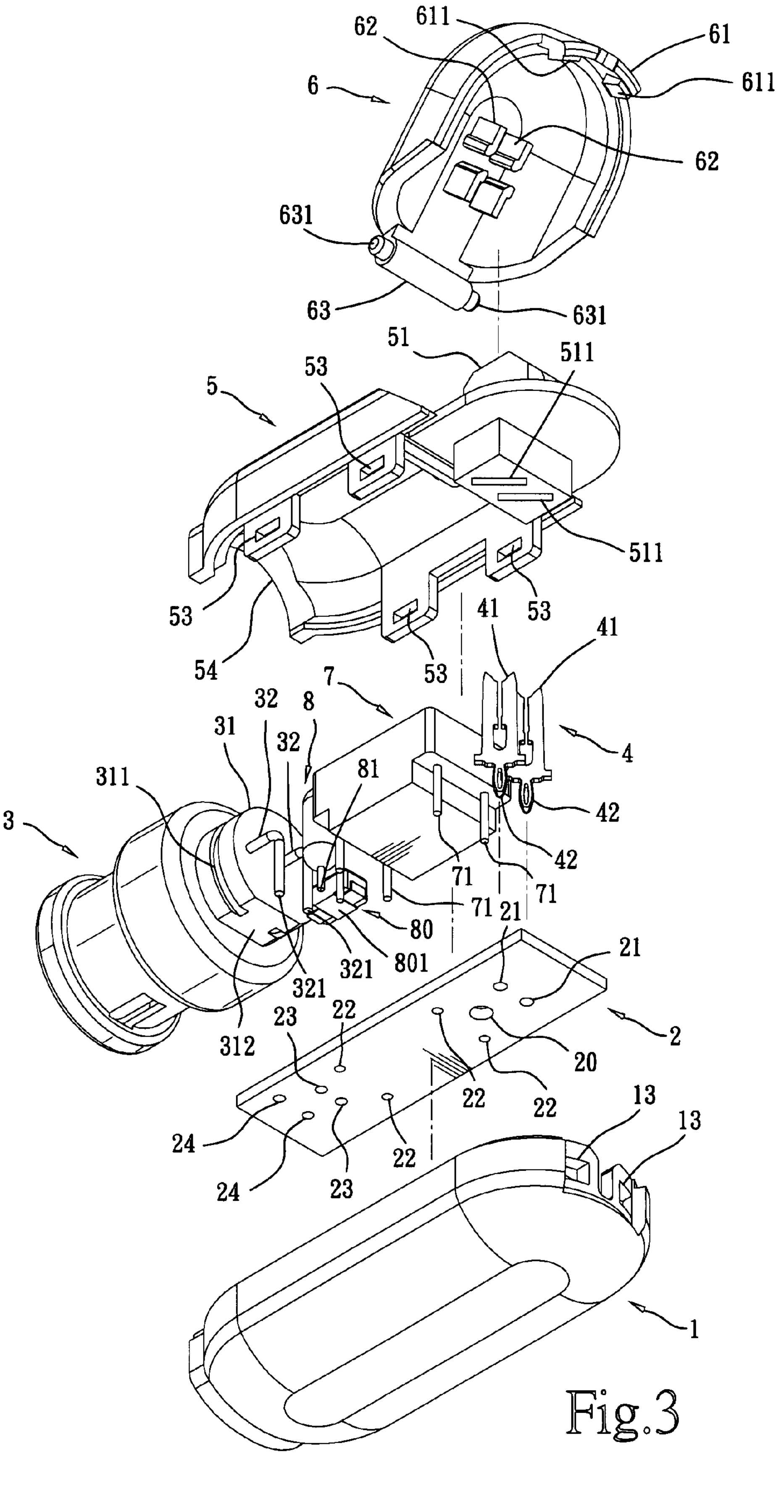
FIG. 3 is another exploded view of the present invention when viewed from another angle.
Figure 4:
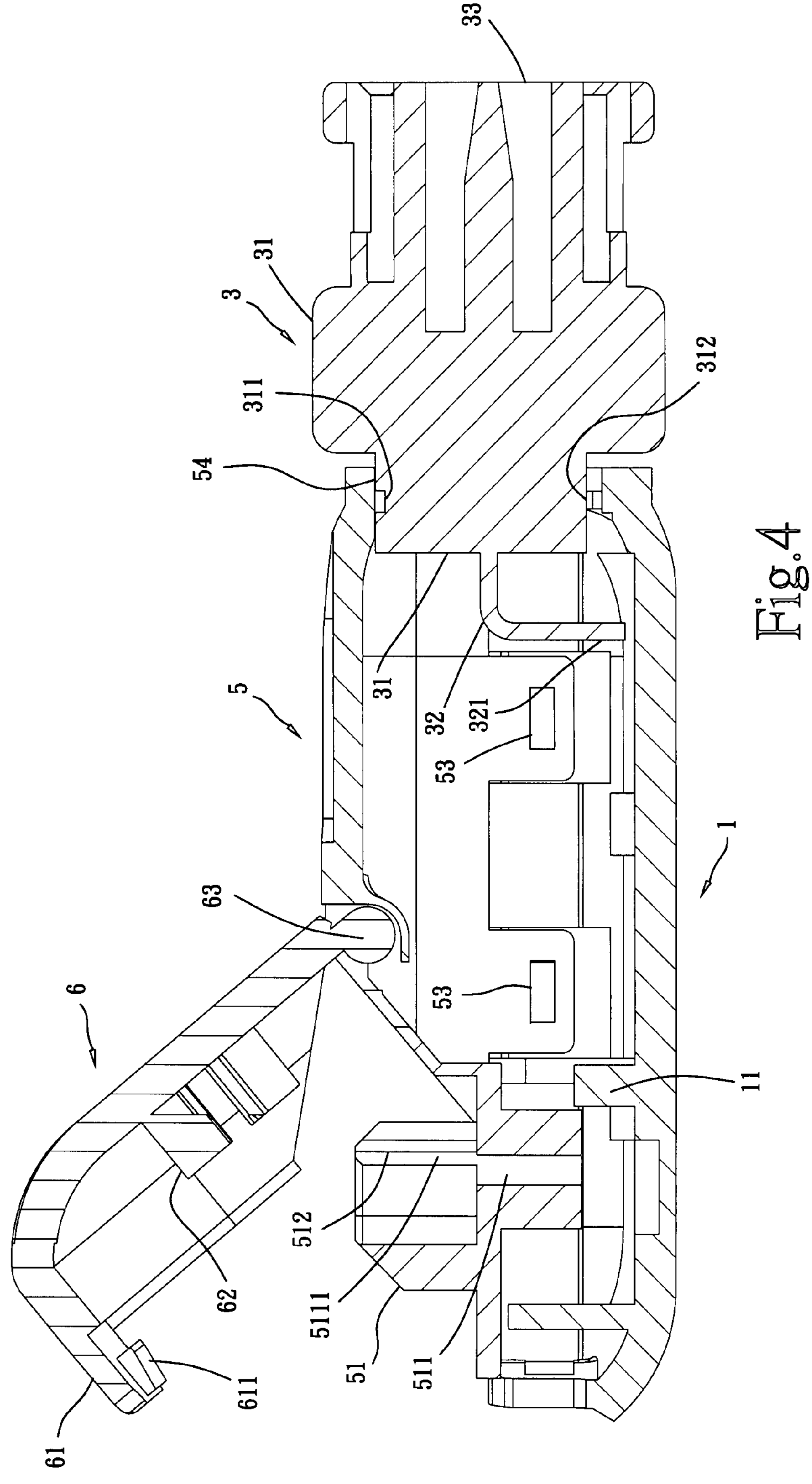
FIG. 4 is a sectional side plain view of the toolless video balun according to the present invention, showing the pressure cap opened from the top cover shell.

When the toolless video balun is assembled, the cylindrical block 31 of the BNC connector 3 is positioned in between the semicircular flange 54 of the top cover shell 5 and the semicircular flange 14 of the bottom cover shell 1 with its flat bottom wall 312 supported on the flat surface portion 142 of the semicircular flange 14 of the bottom cover shell 1 and its locating groove 311 fastened to the engagement ribs 141 of the semicircular flange 14 of the bottom cover shell 1 (see FIGS. 1 and 3). Therefore, the BNC connector 3 is firmly secured to the top cover shell 5 and the bottom cover shell 1. When opened the pressure cap 6, a network line's two wires 60 are respectively inserted into the wire grooves 5111 of the top cover shell 5 and rested in sharp-edged top metal holder portion 41 of the metal terminals 4, and then the pressure cap 6 is turned downwards from the open position to the close position to force the holding down blocks 62 into the wire grooves 5111 of the top cover shell 5. At this time, the wires 60 are "punched down" by holding down blocks 62 into the a sharp-edged top metal holder portions 41 of the metal terminals 4 which cut into the insulation of the wires 60 and make contact with the conductors of the wires 60 respectively, thus causing the electrical connection to be made. When the pressure cap 6 is turned from the open position to the close position, the retaining blocks 611 of the extension flange 61 are respectively forced into engagement with the retaining holes 13 of the bottom cover shell 1, and therefore the pressure cap 6 is locked.

Figure 7:
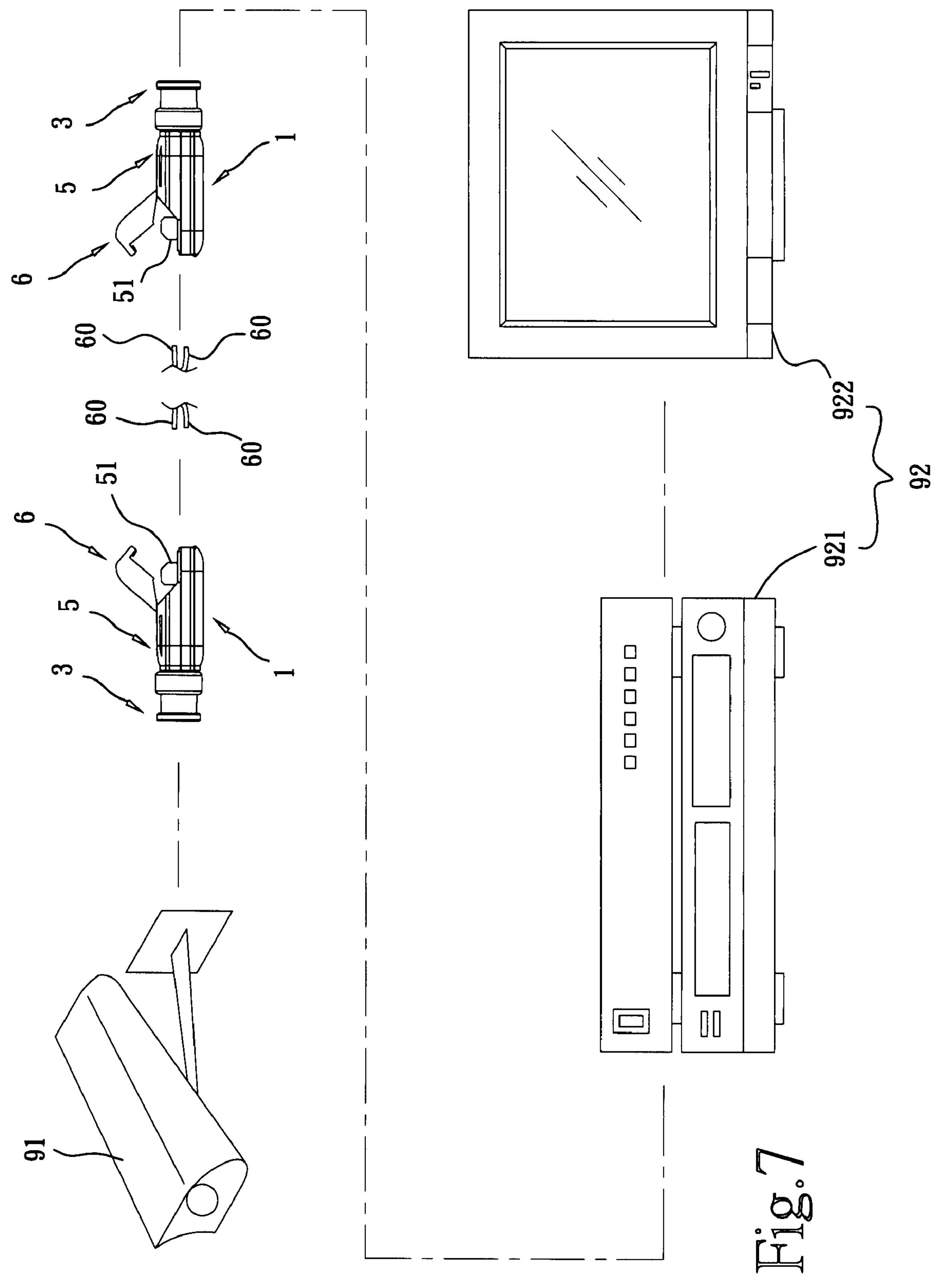
FIG. 7 is a schematic drawing showing an application example of the present invention in a video surveillance system.

FIG. 7 shows an application example of the present invention. As illustrated, the metal terminals 4 of two BNC connectors 3 are respectively connected to the opposite ends of the two wires 60 of a network line that extends from one wall to another wall inside a building, and the BNC connectors 3 of the two toolless video baluns are respectively electrically connected to the electronic video camera 91 and video terminal unit 92 of a video surveillance system. The video terminal unit 92 is comprised of a DVD player 921 and a monitor 922.

As stated above, the invention provides a toolless video balun, which has the following features and advantages:

1. The toolless video balun can easily and quickly be connected to the wires 60 of a network line without tools.

2. The top cover shell 5 and the bottom cover shell 1 have locating means to secure the BNC connector 3 firmly in place.

3. When the pressure cap 6 is closed to hold down the wires 60 of the network line in the top cover shell 5, the retaining blocks 611 of the extension flange 61 are respectively forced into engagement with the f retaining holes 13 of the bottom cover shell 1, securing the pressure cap 6 firmly in the close position.

What is claimed is:

1. A toolless video balun comprising:

a bottom cover shell;

a circuit board mounted in said bottom cover shell;

a winding transformer mounted on said circuit board;

a resistor mounted on said circuit board;

a diode mounted on said circuit board;

a BNC connector mounted on said circuit board and extending out of said bottom cover shell, said BNC connector comprising a front end, a cylindrical block extending from said front end and disposed inside said bottom cover shell, a plurality of metal pins extending out of said cylindrical block and bonded to said circuit board, a rear end suspending outside said bottom cover shell, and a plurality of insertion holes formed in said rear end;

a plurality of metal terminals respectively electrically bonded to said circuit board; and a top cover shell covering said bottom cover shell;

wherein:

said bottom cover shell comprises a semicircular flange extending from an open end thereof, the semicircular flange of said bottom cover shell having two engagement ribs protruding from a top wall thereof and symmetrically disposed at two sides, and a flat surface portion disposed between said two engagement ribs;

said circuit board comprises a plurality of via holes for the bonding of said winding transformer, said resistor, said plurality of metal terminals and the plurality of metal pins said BNC connector, and a bonding pad for the bonding of said diode;

said cylindrical block of said BNC connector has a flat bottom wall supported on the flat surface portion of the semicircular flange of said bottom cover shell, and a locating groove extending around the periphery thereof and forced into engagement with the engagement ribs of the semicircular flange of said bottom cover shell;

said plurality of metal terminals are respectively bonded to corresponding ones of said plurality of via holes of said circuit board, said plurality of metal terminals each having a sharp-edged top metal holder portions respectively inserted into said top cover shell;

said top cover shell comprising a terminal block disposed at one end thereof, two insertion slots vertically extending through top and bottom sides of said terminal block, for receiving the sharp-edged top metal holder portions of said metal terminals, a plurality of wire grooves formed in the top side of said terminal block and respectively disposed in communication with said two insertion slots for receiving electrical wires of a network line, an opening disposed adjacent to said plurality of wire grooves, two coupling holes disposed in said opening at two sides, a pressure cap pivoted to said two coupling holes in said opening for holding down the electrical wires of a network line in said plurality of wire grooves for causing the metal holder portions of said plurality of metal terminals to make contact with conductors of the electrical wires respectively, and a semicircular flange extending from an opposite end thereof and pressed on the cylindrical block of said BNC connector against the semicircular flange of said bottom cover shell.

2. The toolless video balun as claimed in claim 1, wherein said pressure block a coupling cap comprising fixedly disposed at a first end thereof, two round pins respectively axially extending from two sides of said coupling block and respectively pivotally coupled to the two coupling holes in the opening of said top cover shell, and a plurality of holding down blocks protruded from a bottom wall thereof for engaging into the plurality of wire grooves of said top cover shell to force electrical the wires into the sharp-edged top metal holder portions of said plurality of metal terminals.

3. The toolless video balun as claimed in claim 1, wherein said bottom cover shell comprises at least one column; said circuit board comprises at least one mounting hole respectively fastened to the at least one column of said bottom cover shell.

4. The toolless video balun as claimed in claim 1, wherein said bottom cover shell comprises a plurality of hooks symmetrically disposed at two opposite lateral sides thereof; said top cover shell comprises a plurality of retaining holes symmetrically disposed at two opposite lateral sides thereof and respectively forced into engagement with the plurality of hooks of said bottom cover shell.

5. The toolless video balun as claimed in claim 1, wherein said bottom cover shell comprises at least one retaining hole disposed at one end thereof opposite to the semicircular flange of said bottom cover shell; said pressure cap comprises a fixed end pivoted to the two coupling holes in said opening of said top cover shell, a free end, and at least one retaining block disposed at said free end for engagement with the at least one retaining hole of said bottom cover shell.

6. The toolless video balun as claimed in claim 5, wherein said pressure cap comprises an extension flange downwardly extending from the free end; the at least one retaining block of said pressure cap is respectively protruded from an inner side of said extension flange.

* * * * *